United States Patent
Liu et al.

(10) Patent No.: US 12,453,052 B2
(45) Date of Patent: Oct. 21, 2025

(54) LIQUID-COOLED PLATE AND HEAT DISSIPATION DEVICE

(71) Applicant: ZTE CORPORATION, Shenzhen (CN)

(72) Inventors: Fan Liu, Shenzhen (CN); Cheng Tao, Shenzhen (CN); Shuai Li, Shenzhen (CN)

(73) Assignee: ZTE Corporation, Shenzhen (CN)

(*) Notice: Subject to any disclaimer, the term of this patent is extended or adjusted under 35 U.S.C. 154(b) by 242 days.

(21) Appl. No.: 17/781,691

(22) PCT Filed: Dec. 2, 2020

(86) PCT No.: PCT/CN2020/133393
§ 371 (c)(1),
(2) Date: Jun. 1, 2022

(87) PCT Pub. No.: WO2021/110052
PCT Pub. Date: Jun. 10, 2021

(65) Prior Publication Data
US 2023/0022410 A1  Jan. 26, 2023

(30) Foreign Application Priority Data
Dec. 3, 2019  (CN) .......................... 201911221327.0

(51) Int. Cl.
*H05K 7/20* (2006.01)

(52) U.S. Cl.
CPC ....... *H05K 7/2039* (2013.01); *H05K 7/20318* (2013.01); *H05K 7/20327* (2013.01)

(58) Field of Classification Search
CPC ............. H05K 7/2039; H05K 7/20318; H05K 7/20327; F28F 13/12; F28F 3/00; F28F 1/128; F28F 13/00
See application file for complete search history.

(56) References Cited

U.S. PATENT DOCUMENTS 6,314,752 B1 * 11/2001 Christensen .............. F28D 3/00
62/484
7,782,616 B1 * 8/2010 Myers ..................... F28F 3/048
361/689

(Continued)

FOREIGN PATENT DOCUMENTS

CN   1624911 A    6/2005
CN   201226636    4/2009

(Continued)

OTHER PUBLICATIONS

CN 107275300 A mt (Year: 2017).*

(Continued)

*Primary Examiner* — Gordon A Jones
(74) *Attorney, Agent, or Firm* — Knobbe, Martens, Olson & Bear, LLP

(57) ABSTRACT

A liquid-cooled plate and a heat dissipation device are disclosed. The liquid-cooled plate includes a single-phase channel and a two-phase channel. First fins are spaced apart in the single-phase channel and second fins are spaced apart in the two-phase channel. The first fins are configured to perform a heat exchange with a liquid-state coolant flowing through the single-phase channel to convert the liquid-state coolant after the heat exchange into a gas-liquid two-phase coolant, and the second fins are configured to perform a heat exchange with a gas-liquid two-phase coolant flowing through the two-phase channel to output a coolant after the heat exchange.

7 Claims, 4 Drawing Sheets

(56) References Cited

U.S. PATENT DOCUMENTS

| | | | |
|---|---|---|---|
| 2005/0082037 A1 | 4/2005 | Thayer et al. | |
| 2007/0163270 A1* | 7/2007 | Chien | F25B 21/02 |
| | | | 257/E23.098 |
| 2013/0021746 A1* | 1/2013 | Campbell | H05K 7/20827 |
| | | | 165/104.13 |
| 2016/0227672 A1* | 8/2016 | Lin | H05K 7/20254 |
| 2017/0321973 A1* | 11/2017 | Campbell | F28D 9/0031 |
| 2018/0331016 A1 | 11/2018 | Kang | |
| 2020/0229321 A1* | 7/2020 | Dogruoz | G02B 6/4269 |
| 2023/0088909 A1* | 3/2023 | Sharfi | H05K 7/20409 |
| | | | 165/80.4 |

FOREIGN PATENT DOCUMENTS

| | | |
|---|---|---|
| CN | 102869943 A | 1/2013 |
| CN | 203722976 U | 7/2014 |
| CN | 204948593 U | 1/2016 |
| CN | 205755233 U | 11/2016 |
| CN | 107275300 A | 10/2017 |
| JP | 2002170915 A | 6/2002 |

OTHER PUBLICATIONS

Shen et al. (Forced convection and heat transfer of water-cooled microchannel heat sinks with various structured metal foams); Beibei Shen a,b, Hongbin Yan a ⇑, , Bengt Sunden c, Hongqian Xue b, Gongnan Xie; International Journal of Heat and Mass Transfer; Available online Jun. 14, 2017 (Year: 2017).*

International Search Report for International Application No. PCT/CN2020/133393, dated Mar. 11, 2021.

Extended European Search Report for European Patent Application No. 20897060.8 dated Nov. 24, 2023.

* cited by examiner

LIQUID-COOLED PLATE AND HEAT DISSIPATION DEVICE

CROSS-REFERENCES TO RELATED APPLICATIONS

This is a National Stage Application filed under 35 U.S.C. 371 based on International Patent Application No. PCT/CN2020/133393, filed on Dec. 2, 2020, which claims priority to Chinese Patent Application No. 201911221327.0 filed with the China National Intellectual Property Administration (CNIPA) on Dec. 3, 2019, the contents of which are incorporated herein by reference in their entireties.

TECHNICAL FIELD

The present disclosure relates to the field of liquid cooling and heat dissipation, for example, to a liquid-cooled plate and a heat dissipation device.

BACKGROUND

With the continuous development of communication technology, the power consumption of electronic devices continuously rises, the power consumption of a single cabinet has been increased from 3-4 kW in the past to the order of 100 kW and the heat flow density reaches more than 20 $W/cm^2$. Air cooling and single-phase liquid are difficult to satisfy the highly-reliable heat dissipation requirement of high heat flow density electronics in the future, and the temperature control has become an essential factor restricting the development of the high heat flow density electronics.

The phase change working medium fluid circuit heat dissipation system based on flow boiling heat exchange has obvious advantages over single-phase heat exchange in solving local high heat flow density and large-scale heat transfer and two-phase fluid circuit will be an effective way to solve the high heat flow in the future. However, a subcooling problem usually exists when the two-phase liquid enters the cold plate to work, one-way heat exchange has a larger thermal resistance than the two-phase heat exchange, which causes the uniformity of the inlet heat dissipation unit and other heat dissipation units to be reduced. Moreover, due to the high pressure of the two-phase system, the optimization mode of the flow channel structure inside the cold plate is limited and the convection heat exchange area for the heat dissipation is limited. When the two-phase system is used for the cabinet cooling, there is a risk that the temperature of the chip will exceed the standard.

SUMMARY

The present application provides a liquid-cooled plate and a heat dissipation device.

An embodiment of the present application provides a liquid-cooled plate including a single-phase channel and a two-phase channel.

First fins are spaced apart in the single-phase channel and second fins are spaced apart in the two-phase channel. The first fins are configured to perform a heat exchange with a liquid-state coolant flowing through the single-phase channel to convert the liquid-state coolant after the heat exchange into a gas-liquid two-phase coolant, and the second fins are configured to perform a heat exchange with a gas-liquid two-phase coolant flowing through the two-phase channel to output a coolant after the heat exchange.

An embodiment of the present application provides a heat dissipation device. The device includes a condenser, a pump, and the liquid-cooled plate of any one of the embodiments of the present disclosure.

The pump is configured to enable a coolant passing through the pump to flow into the liquid-cooled plate to perform heat absorption, and the condenser is configured to enable the coolant after the heat absorption to flow back into the liquid-cooled plate after heat release.

DETAILED DESCRIPTION

Embodiments of the present application are described below in conjunction with drawings. If not in collision, the embodiments of the present application and features in the embodiments may be combined with each other. In the embodiments of the present application, a liquid-cooled is the phase change working fluid circuit heat dissipation structure based on flow boiling heat exchange, which can solve problems of a locally high heat flow density and a large-scale heat transfer. The two-phase liquid-cooled technology has the advantages described below.

1. The heat flow density of the heat exchange is high. A boiling heat exchange coefficient may reach 1 to 10 $W/cm^2K$, which is one order of magnitude higher than a single-phase liquid-cooled technology.

2. The heat transfer capacity is high. Latent heat of vaporization of the liquid is used in a phase change process, and a latent heat value of the phase change is dozens of times higher than that of the water cooling.

3. The temperature uniformity is great. In the evaporation process, isothermal phase change evaporation is performed; therefore, the temperature uniformity of multiple cold plates in a multi-evaporator series system is great, and the uniform multi-point heat source has outstanding advantages.

In the embodiments of the present application, a liquid-cooled plate is configured to include two parts: a single-phase channel for subcooling liquid and a two-phase channel for overheating gas. A low-temperature liquid-state coolant and a high-temperature gas-liquid two-phase refrigerant exchange heat in the liquid-cooled plate, so that the subcooling coolant is preheated to a certain extent and approaches a saturation state, thereby solving the problems that the temperature of the chip is relatively high and the uniformity of the overall temperature of the chip is relatively poor caused by the single-phase heat exchange at the inlet. The inner channel surface of the liquid-cooled plate is machined to artificially increase the surface roughness or the foam metal material is added to increase a boiling heat exchange coefficient, and thus under a limited convection heat exchange area, the boiling heat exchange can be strengthened, the thermal resistance of the convection heat exchange can be reduced, and the temperature difference between the chip and the cooling working medium can be reduced, so as to solve the problems that the thermal resistance of the convection heat exchange is relatively large and the chip is easy to overheat in the flow channel design.

Figure 1:
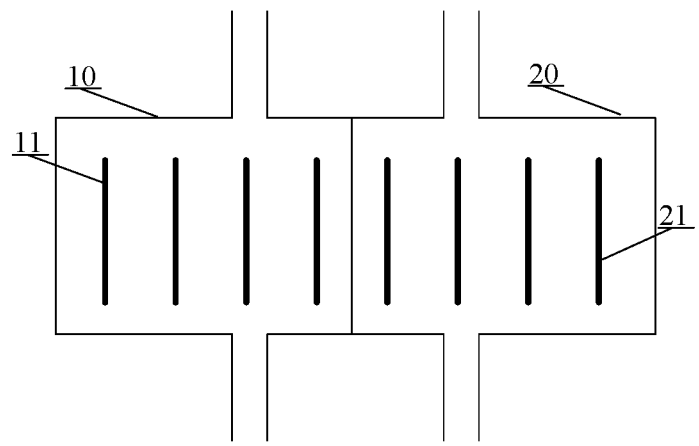
FIG. 1 is a structural diagram of a liquid-cooled plate according to an embodiment of the present disclosure.

FIG. 1 is a structural diagram of a liquid-cooled plate according to an embodiment of the present disclosure. Referring to FIG. 1, the liquid-cooled plate in the embodiment of the present application includes a single-phase channel 10 and a two-phase channel 20. First fins 11 are spaced apart in the single-phase channel 10 and second fins 21 are spaced apart in the two-phase channel 20. A liquid-state coolant becomes a gas-liquid two-phase coolant after a heat exchange of the first fins 11 in the single-phase channel 10 and is output after a heat exchange of the second fins 21 in the two-phase channel 20.

The liquid-cooled plate in the embodiment of the present application includes the single-phase channel and the two-phase channel. The first fins are spaced apart in the single-phase channel and the second fins are spaced apart in the two-phase channel. The first fins are configured to perform the heat exchange with the liquid-state coolant flowing through the single-phase channel to convert the liquid-state coolant after the heat exchange into the gas-liquid two-phase coolant, and the second fins are configured to perform the heat exchange with the gas-liquid two-phase coolant flowing through the two-phase channel to output the coolant after the heat exchange. In one embodiment, the single-phase channel 10 may be a channel through which a coolant flows, the structure of the single-phase channel 10 may be a round tube or a flat tube, the first fins 11 may be provided inside the single-phase channel 10, multiple first fins 11 may be provided, the first fins 11 may flow in a same direction as the coolant in the single-phase channel 10, and the multiple first fins 11 may be arranged in parallel. The first fins 11 arranged in the single-phase passage 10 can raise the heat exchange efficiency and improve the heat dissipation effect of the coolant. The two-phase channel 20 and the single-phase channel 10 may have a same structure which may be a round tube or a flat tube. The second fins 21 may be provided inside the two-phase channel 20. Multiple second fins 21 may be spaced apart. The two-phase channel 20 may be a channel through which a coolant of a gas-liquid two-phase working medium flows. The coolant may absorb heat in the single-phase channel 10 and convert from liquid to the gas-liquid two-phase coolant. The converted gas-liquid two-phase coolant may flow into the liquid-cooled plate through the two-phase channel 20 to perform the heat exchange again. The gas-liquid two-phase coolant after the heat exchange may flow out of the liquid-cooled plate. Since the heat exchange temperature difference of the gas-liquid two-phase coolant is low, the problem of subcooling of the liquid-cooled plate can be prevented.

Figure 2A:
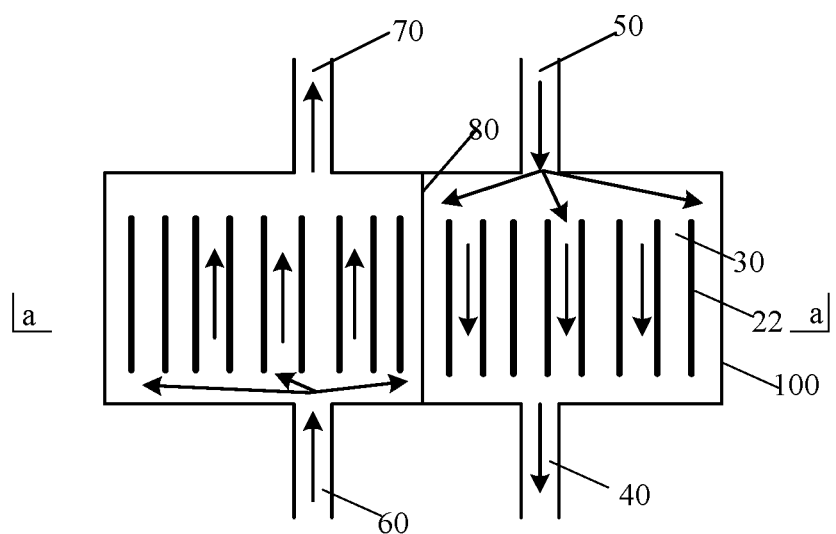
FIG. 2A is a structural diagram of a liquid-cooled plate according to an embodiment of the present disclosure.
Figure 2B:
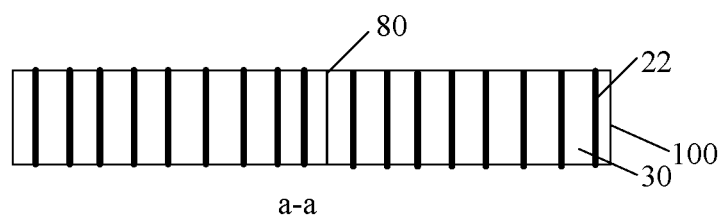
FIG. 2B is a structural diagram of a liquid-cooled plate according to an embodiment of the present disclosure.

In the embodiment of the present disclosure, FIGS. 2A and 2B are structural diagrams of liquid-cooled plates according to embodiments of the present disclosure. Referring to FIGS. 2A and 2B, FIG. 2B is a sectional view of the liquid-cooled plate along a direction a-a of FIG. 2. The liquid-cooled plate 100 may be composed of the single-phase channel and the two-phase channel. The coolant in a liquid state may flow into the single-phase channel of the liquid-cooled plate through a single-phase inlet 50 of the single-phase channel. Multiple fins 22 may be provided inside the single-phase channel. A gap existing between two fins 22 of the multiple fins 22 forms a fluid channel 30 for the coolant flowing. The coolant may exchange the heat in the fluid channel 30 to absorb the heat emitted by a chip to be heat dissipated. After the heat exchange, the coolant may be converted from the liquid state to a gas-liquid two-phase state. That is, both a liquid coolant and a gas coolant are included. The gas-liquid two-phase coolant may flow out from a single-phase outlet 40. The coolant in the gas-liquid two-phase state may flow in through a two-phase channel inlet 60 to perform heat exchange again in the fluid channel and may flow out through a two-phase channel outlet 70. In one embodiment, the two-phase channel may have a same structure as the single-phase channel, the two-phase channel and the single-phase channel may be separated by a spacing 80, and the two-phase channel may also include the fins 22 to increase the heat dissipation area and improve the heat exchange effect of the liquid-cooled plate.

In the technical scheme of the present application, the single-phase channel and the two-phase channel form the liquid-cooled plate. The first fins are spaced apart in the single-phase channel and the second fins are spaced apart in the two-phase channel. The liquid-state coolant becomes the gas-liquid two-phase coolant after the heat exchange of the first fins of the single-phase channel and is output after the heat exchange of the second fins of the two-phase channel, so as to achieve the temperature uniformity of the liquid-cooled plate, reduce the thermal resistance of the convection heat exchange, improve the cooling effect and effectively prevent the problem of sub cooling.

In one embodiment, a surface of the first fin in the liquid-cooled plate is a rough surface and/or a surface of the second fin is a rough surface.

Figure 3:
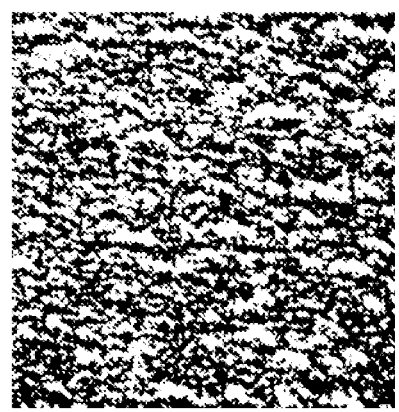
FIG. 3 is an exemplary diagram of a fin surface according to an embodiment of the present application.

FIG. 3 is an exemplary diagram of a fin surface according to an embodiment of the present application. Referring to FIG. 3, in the embodiment of the present application, the fins in the liquid-cooled plate may be machined so that the surface of the fins becomes the rough surface, so that the heat dissipation area can be increased, and a vaporization core for the boiling heat exchange can be formed to improve the heat exchange effect of the liquid-cooled plate. In one embodiment, according to the heat dissipation requirements of the liquid-cooled plate, the surface of the first fin in the single-phase channel may be machined as the rough surface or the surface of the second fin in the two-phase channel may be machined as the rough surface. For example, to satisfy the requirements of the heat dissipation effect of the chip to be heat dissipated, the surface of the second fin in the two-phase channel may be machined as the rough surface, and the surface of the first fin in the single-phase channel may keep a smooth surface without being machined. In one embodiment, the surface of the first fin in the single-phase channel and the surface of the first fin in the two-phase channel may not both be the rough surface at the same time.

In one embodiment, internal surfaces of cavities of the single-phase channel and the two-phase channel may be treated as the rough surface.

In one embodiment, metal foam is filled between the first fins and/or metal foam is filled between the second fins.

Figure 4:
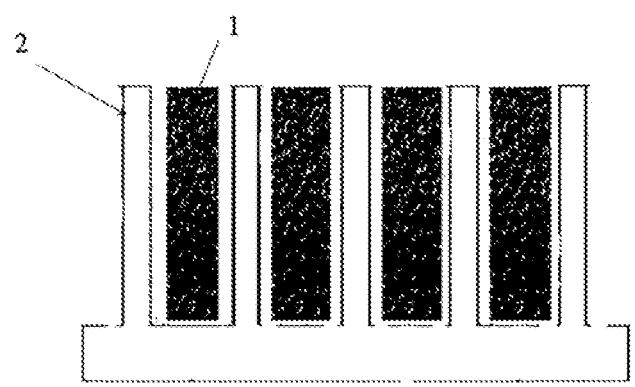
FIG. 4 is a schematic diagram illustrating an application of metal foam according to an embodiment of the present application.

FIG. 4 is a schematic diagram illustrating an application of metal foam according to an embodiment of the present application. Referring to FIG. 4, in one embodiment, metal foam 111 may be filled between the fins 22 in the liquid-cooled plate to increase the heat dissipation area. The metal foam 111 may be a special metal material containing foam pores and may be used as the vaporization core for the boiling heat exchange. The metal foam may be filled in the gap between the first fins and the gap between the second fins in the liquid-cooled plate. In one embodiment, the metal foam may be filled only in the gap between the first fins or the metal foam may be filled only in the gap between the second fins.

In one embodiment, the metal foam is attached to the surface of the first fin and/or the metal foam is attached to the surface of the second fin.

Figure 5:
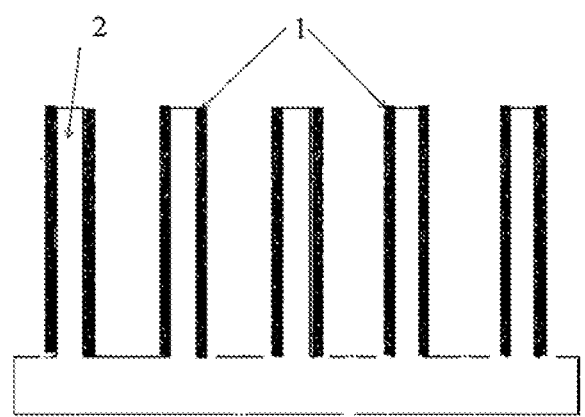
FIG. 5 is a schematic diagram illustrating another application of metal foam according to an embodiment of the present application.

In the embodiment of the present application, the metal foam may also be attached to an inner fin of the liquid-cooled plate. FIG. 5 is a schematic diagram illustrating another application of metal foam according to an embodiment of the present application. Referring to FIG. 5, the metal foam 111 may be wrapped around the fins 22 in the liquid-cooled plate. The metal foam 111 may be attached to the surface of the first fin or the surface of the second fin. In one embodiment, the metal foam may be attached only to the surface of the first fin or the metal foam may be attached only to the surface of the second fin.

In one embodiment, the first fin is formed by the metal foam and/or the second fin is formed by the metal foam.

Figure 6:
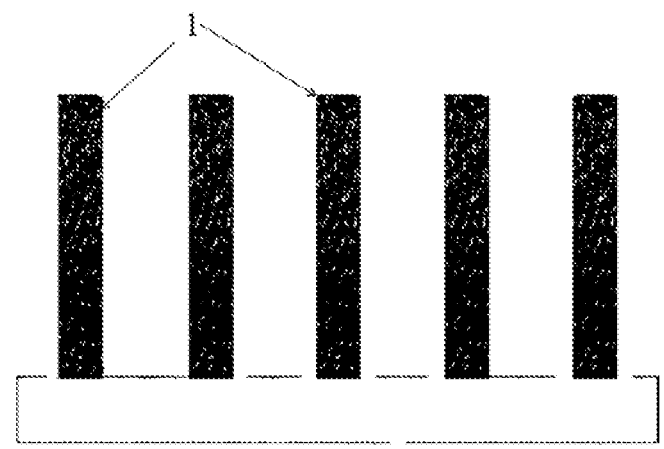
FIG. 6 is a schematic diagram illustrating another application of metal foam according to an embodiment of the present application.

In one embodiment, in the liquid-cooled plate, the metal foam may be directly used as the fins for the heat exchange, which can improve the heat dissipation area of the coolant and the liquid-cooled plate and improve the heat dissipation effect by the boiling heat exchange. The first fin or the second fin may be formed by the metal foam. FIG. 6 is a schematic diagram illustrating another application of metal foam according to an embodiment of the present application. Referring to FIG. 6, metal foam 111 may be served as the fins and arranged in the liquid-cooled plated, and may be served as the first fins of the single-phase channel and the second fins of the two-phase channel separately. In one embodiment, the first fins and the second fins may not both be the metal foam at the same time. In one embodiment, not all of the first fins and the second fins in the liquid-cooled plated are the metal foam at the same time, and in the two-phase channel, a threshold number of second fins may be the metal foam, and other second fins may be fins of the normal material, such as an iron, a copper, aluminum and the like.

Figure 7:
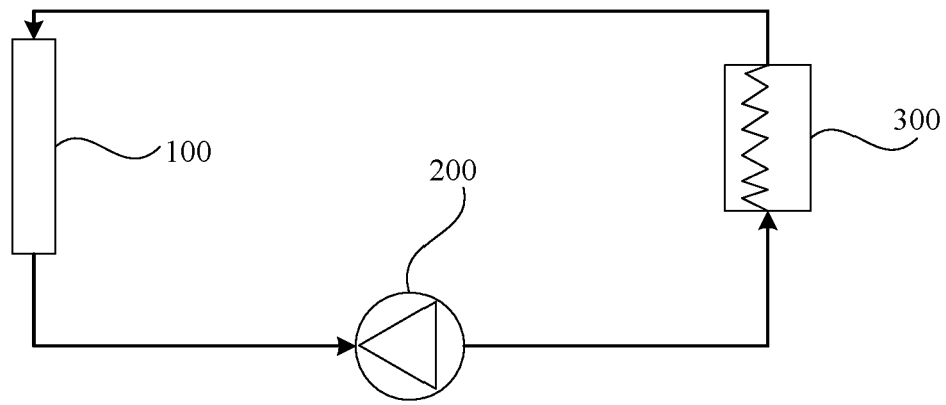
FIG. 7 is a structural diagram of a heat dissipation device according to an embodiment of the present disclosure.

FIG. 7 is a structural diagram of a heat dissipation device according to an embodiment of the present disclosure. Referring to FIG. 7, the heat dissipation device in the embodiment of the present application may include a condenser 300, a pump 200 and the liquid-cooled plated 100 of any one of the embodiments of the present application. A coolant passes through the pump 200 and flows into the liquid-cooled plate 100 to perform heat absorption. The coolant after the heat absorption flows back into the liquid-cooled plate 100 after heat release by passing through the condenser 300.

The pump is configured to enable the coolant passing through the pump to flow to the liquid-cooled plate to perform the heat absorption, and the condenser is configured to enable the coolant after the heat absorption to flow back to the liquid-cooled plate after the heat release.

In one embodiment, the heat dissipation device may be composed of the liquid-cooled plate 100, the pump 200, and the condenser 300. The liquid-cooled plate 100 may be connected to the pump 200 and the condenser 300 through a fluid pipe, the coolant may flow through the fluid pipe and circulate in the liquid-cooled plate 100, the pump 200 and the condenser 300, the pump 200 may be a coolant circulating pump which may accelerate a flow speed of the coolant in the heat dissipation device, and the pump 200 may include a vacuum pump, a turbo pump and the like. The condenser 300 may be a device that absorbs the heat of the coolant to convert the coolant from a gaseous state or a gas-liquid two-phase state to a liquid, and may include a spray condenser, a fill condenser, a water drip condenser and the like. In the heat dissipation device, the coolant absorbs the heat in the liquid-cooled plate and releases the heat in the condenser, and dissipates the heat of an object to be heat dissipated. In one embodiment, refrigerated water or refrigerant may generally be stored in the condenser 300 to convert the coolant from the gas to the liquid. In one embodiment, to speed up the heat dissipation efficiency, the heat dissipation device may include multiple liquid-cooled plates 100, and the liquid-cooled plates 100 may be connected in series or in parallel.

In one embodiment, to protect the safety of the pump 200, the temperature of the coolant entering the pump 200 needs to be kept below a certain temperature, and a liquid-cooled plate only including a single-phase channel may be arranged in front of an inlet of the pump 200, so that the liquid-cooled plate is subcooled and the temperature of the coolant entering the pump 200 is lowered.

Figure 8:
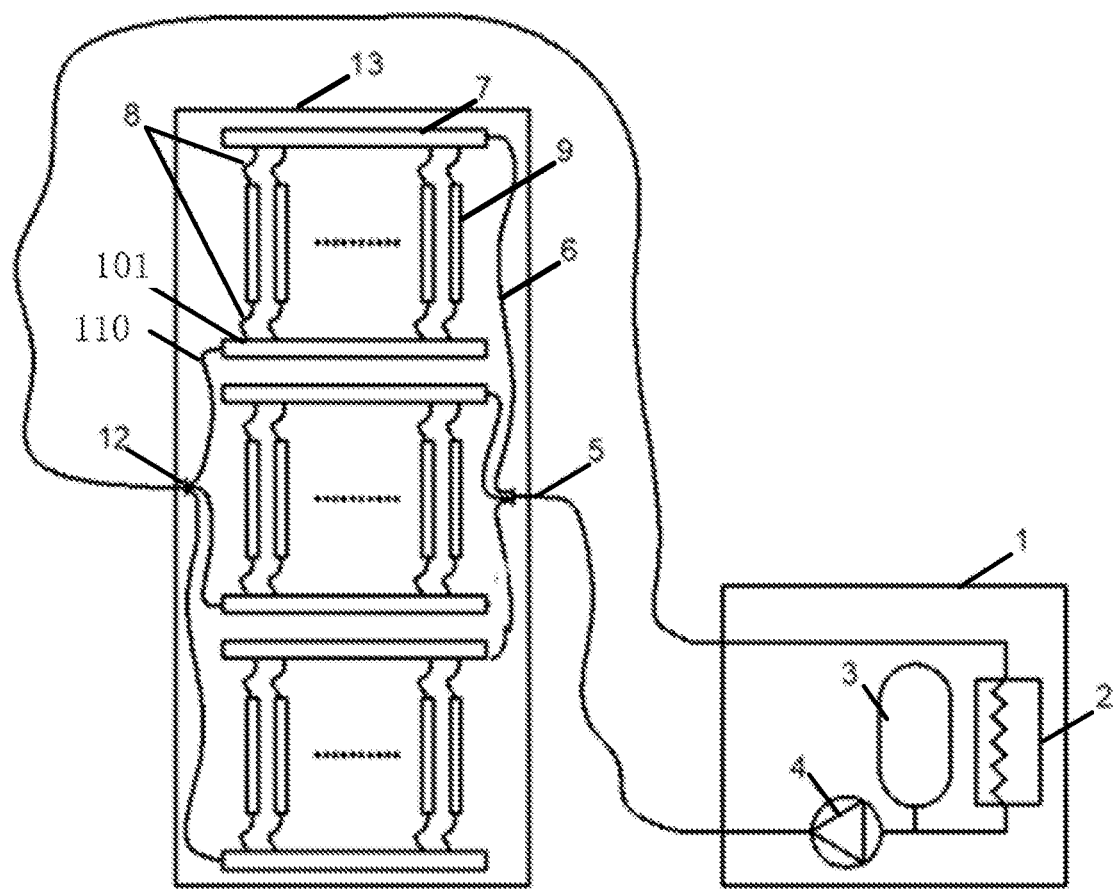
FIG. 8 is a structural diagram of another heat dissipation device according to an embodiment of the present disclosure.

FIG. 8 is a structural diagram of another heat dissipation device according to an embodiment of the present disclosure. Referring to FIG. 8, the heat dissipation device of the embodiment of the present disclosure further includes a liquid storage tank 3, a liquid supply pipeline 5, a liquid supply branch pipeline 6, a liquid supply dispenser 7, a connection pipe 8, a single plate 9, a liquid return collection pipe 101, a liquid return branch pipe 110 and a liquid return main pipe 12. At least two liquid-cooled plates are arranged in the single plate 9; and the condenser 2, the liquid storage tank 3, the pump 4, the liquid supply pipeline 5, the liquid supply branch pipeline 6, the liquid supply dispenser 7, the connection pipe 8, the single plate 9, the liquid return collection pipe 101, the liquid return branch pipe 110 and the liquid return main pipe 12 are sequentially connected to form a circuit.

In one embodiment, the liquid storage tank 3 may be a storage tank for storing the refrigerant or the refrigerated water. The refrigerant may be Freon which can provide the refrigerant for the condenser. The liquid supply pipeline 5, the liquid supply branch pipeline 6, the liquid supply dispenser 7, the connection pipe 8, the liquid return collection pipe 101, the liquid return branch pipe 110 and the liquid return main pipe 12 may be fluid channels connected with multiple single plates 9, which facilitates the circulation of the coolant in the heat dissipation device. Under the driving of the pump 4, the coolant enters the liquid supply dispenser 7 through the liquid supply pipeline 5 and the liquid supply branch pipeline 6. The liquid-phase refrigerant is distributed by the liquid supply dispenser 7 to enter the connection pipe 8 and the liquid-cooled plate. The liquid-cooled plate may be connected to the object to be heat dissipated. When the object to be heat dissipated dissipates the heat, the coolant absorbs the heat and boils, and then is converted into the gas-liquid two-phase state. After that, the coolant flows through the connection pipe 8 and is collected into the liquid return collection pipe 101, and then returns to a pump driving unit 1 through the liquid return branch pipe 110 and the liquid return main pipe 12. The heat of the two-phase refrigerant is dissipated through the condenser 2. The single plates 9 may be a device provided with multiple liquid-cooled plates, a clamping slot may be preset in the single plate 9, and the liquid-cooled plate may be inserted into the clamping slot. In one embodiment, multiple single plates 9 may be provided, and the single plates 9 may be connected in series or in parallel. FIG. 8 merely shows a parallel connection manner.

In the embodiment of the present application, the coolant may enter the liquid-cooled plate in the single plate 9 through a lower part of the single plate 9, and the gas-liquid two-phase coolant may enter into the two-phase channel in the liquid-cooled plate close to an upper part of the single plate, and the liquid coolant may enter into the single-phase channel in the liquid-cooled plate close to a lower part of the single plate. With the heat exchange structure of the liquid-cooled plate in the embodiment of the application, the speed of the subcooling coolant approaching the saturation state can be accelerated, the thermal resistance of the convection heat exchange in the liquid-cooled plate can be reduced, and the heat exchange efficiency can be improved.

In one embodiment, at least two single plates within the single plate 9 are connected in series.

Figure 9:
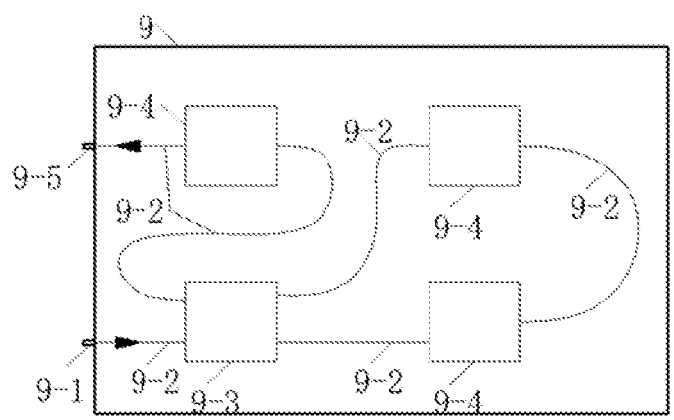
FIG. 9 is a diagram illustrating a connection relationship of a liquid-cooled plate according to an embodiment of the present disclosure.

In one embodiment, multiple liquid-cooled plates may be arranged within the single plate 9 as needed, and the liquid-cooled plates in the single plate may be connected in series or in parallel. In one embodiment, the single plate 9 may also include a liquid-cooled plate only including a single-phase channel. FIG. 9 is a diagram illustrating a connection relationship of a liquid-cooled plate according to an embodiment of the present disclosure. Referring to FIG. 9, the single plate 9 includes one two-phase liquid-cooled plate 9-3 having the single-phase channel and the two-phase channel, and three single-phase liquid-cooled plates 9-4 having one single-phase channel. Multiple liquid-cooled plates are connected in series, the two-phase liquid-cooled plate 9-3 may be arranged at an inlet 9-1 of the single plate, and the three single-phase liquid-cooled plates 9-4 may be arranged at an outlet 9-5 of the single plate, which can reduce the temperature of the coolant and ensure that the temperature of the coolant entering the pump 4 will not cause damages to the pump 4. The coolant flows through multiple liquid-cooled plate through the fluid channels 9-2, and the coolant in the liquid state becomes the gas-liquid two-phase coolant after passing through one or more two-phase liquid-cooled plates 9-3 or single-phase liquid-cooled plates 9-4, so that the gas-liquid two-phase coolant may flow into the two-phase channel of the two-phase liquid-cooled plate 9-3 for the heat exchange. The gas-liquid two-phase coolant returns to the two-phase liquid-cooled plate 9-3 to be fully heat exchanged, which can reduce the heat resistance of the convection heat exchange in the single plate, make the heat exchange of the single plate uniform, and improve the heat exchange effect of the heat dissipation device.

In one embodiment, the single plate is connected to at least one chip to be heat dissipated.

The chip to be heat dissipated may be a chip that needs to be heat dissipated, and the chip to be heat dissipated may emit a large amount of heat when it operates. In a case where the heat dissipation of the chip to be heat dissipated is not uniform or the chip to be heat dissipated is not heat dissipated in time, the chip to be heat dissipated itself can be damaged.

In one embodiment of the present application, the chip to be heat dissipated may be connected to the single plate 9 of the heat dissipation device by pasting of thermal grease or inserting. Referring to FIG. 9, the two-phase liquid-cooled plate 9-3 and the single-phase liquid-cooled plate 9-4 may be pasted with multiple chips to be heat dissipated. When the chips to be heat dissipated operate, the coolant absorbs the heat generated by the chips and boils, and is converted from the liquid to the gas-liquid two-phase state, and then flows back to the pump 4 through the connected cooled plate outlet 9-2. In one embodiment, the two-phase liquid-cooled plate 9-3 may be connected to a low-power chip, and the single-phase liquid-cooled plate 9-4 may be connected to a high-power chip. The heat generated by the low-power chip when the low-power chip operates is less than the heat generated by a high-power chip when the high-power chip operates. The chip to be heat dissipated may be connected to multiple liquid-cooled plates according to the power of the chip to be heat dissipated.

In one embodiment, the heat dissipation device includes at least two single plates 9, and the at least two single plates 9 are connected in parallel.

In the embodiment of that present application, the heat dissipation device may be composed of multiple single plates. The heat dissipation device may be designed according to a cabinet to be heat dissipated, the single plates are configured to be multiple layers, multiple single plates can be arranged in each layer, multiple liquid-cooled plates may be arranged on each single plate, and multiple chips to be heat dissipated may be arranged on each liquid-cooled plate. In one embodiment, the single plates in the multiple layers may be connected in parallel.

In possible implementations, the liquid-cooled plate provided by the embodiment of the present application is applied to the two-phase heat dissipation of the electronic devices. The liquid-cooled plate provided by the present application is to solve the problems that the temperature uniformity of the liquid-cooled plate at the inlet is poor due to the subcooling liquid working medium and the heat dissipation area of the liquid-cooled plate is limited and the thermal resistance is large when the evaporation heat exchange cooled plate of the two-phase working medium is used for the heat dissipation of the circuit board.

The above are only exemplary embodiments of the present application and are not intended to limit the scope of the present application.

What is claimed is:

1. A heat dissipation device, comprising:
   a condenser, a pump, and a dual channel liquid-cooled plate;
   wherein the dual channel liquid-cooled plate comprises a single-phase channel and a two-phase channel, wherein first fins are spaced apart in the single-phase channel and second fins are spaced apart in the two-phase channel; and the first fins are configured to perform a heat exchange with a liquid-state coolant flowing through the single-phase channel to convert the liquid-state coolant after the heat exchange into a gas-liquid two-phase coolant, and the second fins are configured to perform a heat exchange with a gas-liquid two-phase coolant flowing through the two-phase channel to output a coolant after the heat exchange; and
   wherein the pump is configured to enable a coolant passing through the pump to flow into the dual channel liquid-cooled plate to perform heat absorption, and the condenser is configured to enable the coolant after the heat absorption to flow back into the dual channel liquid-cooled plate after heat release;

wherein the heat dissipation device further comprises a single plate, the single plate comprises at least one dual channel liquid-cooled plates having the single-phase channel and the two-phase channel, and multiple single channel liquid-cooled plates having one single channel; a dual channel liquid-cooled plate is arranged at an inlet of the single plate, and a single channel liquid-cooled plate is arranged at an outlet of the single plate; the at least one dual channel liquid-cooled plates is sequentially connected in series with the multiple single channel liquid-cooled plates; one single channel liquid-cooled plate of the multiple single channel liquid-cooled plates is connected back to the dual channel liquid-cooled plate arranged at the inlet of the single plate, and the dual channel liquid-cooled plate arranged at the inlet of the single plate is connected in series with single channel liquid-cooled plate located after the one single channel liquid-cooled plate of the multiple single channel liquid-cooled plates;

wherein the heat dissipation device further comprises: a liquid storage tank, a liquid supply pipeline, a liquid supply branch pipeline, a liquid supply dispenser, a connection pipe, a liquid return collection pipe, a liquid return branch pipe, and a liquid return main pipe; and wherein the condenser, the liquid storage tank, the pump, the liquid supply pipeline, the liquid supply branch pipeline, the liquid supply dispenser, the connection pipe, the single plate, the liquid return collection pipe, the liquid return branch pipe, and the liquid return main pipe are sequentially connected to form a circuit.

2. The heat dissipation device of claim 1, wherein the single plate is connected to at least one chip to be heat dissipated.

3. The heat dissipation device of claim 1, wherein at least two single plates are provided, and the at least two single plates are connected in parallel.

4. The heat dissipation device of claim 1, wherein a surface of at least one of a first fin or a second fin is a rough surface.

5. The heat dissipation device of claim 1, wherein a metal foam is attached to a surface of at least one of a first fin or a second fin.

6. The heat dissipation device of claim 1, wherein a metal foam is filled between at least one of a first fin or a second fin.

7. The heat dissipation device of claim 1, wherein a metal foam is filled between at least one of a first fin or a second fin.

* * * * *